United States Patent
Wu et al.

(10) Patent No.: US 11,803,249 B2
(45) Date of Patent: Oct. 31, 2023

(54) HUMAN-COMPUTER INTERACTION METHOD AND INTERACTION SYSTEM BASED ON CAPACITIVE BUTTONS

(71) Applicant: Shenzhen University, Shenzhen (CN)

(72) Inventors: Kaishun Wu, Shenzhen (CN); Maoning Guan, Shenzhen (CN)

(73) Assignee: Shenzhen University, Shenzhen (CN)

( * ) Notice: Subject to any disclaimer, the term of this patent is extended or adjusted under 35 U.S.C. 154(b) by 0 days.

(21) Appl. No.: 17/888,990

(22) Filed: Aug. 16, 2022

(65) Prior Publication Data

US 2022/0391023 A1 Dec. 8, 2022

Related U.S. Application Data

(63) Continuation of application No. PCT/CN2020/116537, filed on Sep. 21, 2020.

(51) Int. Cl.
G09G 5/00 (2006.01)
G06F 3/02 (2006.01)
H03K 17/96 (2006.01)

(52) U.S. Cl.
CPC ............ *G06F 3/02* (2013.01); *H03K 17/962* (2013.01)

(58) Field of Classification Search
CPC ............ G06F 3/02; G06F 3/023; G06F 3/044; H03K 17/962
See application file for complete search history.

(56) References Cited

U.S. PATENT DOCUMENTS

| 2011/0193820 A1* | 8/2011 | Chen ................. G06F 3/0412 345/173 |
| 2017/0178346 A1* | 6/2017 | Ferro ................. G06N 3/084 |
| 2020/0012347 A1 | 1/2020 | Wu et al. |

FOREIGN PATENT DOCUMENTS

| CN | 101908875 A | 12/2010 |
| CN | 104092458 A | 10/2014 |
| CN | 104205019 A | 12/2014 |
| CN | 106775114 A | 5/2017 |
| CN | 109947243 A | 6/2019 |

* cited by examiner

*Primary Examiner* — Insa Sadio
(74) *Attorney, Agent, or Firm* — Nitin Kaushik (57) ABSTRACT

The present application discloses a human-computer interaction method and an interaction system based on capacitive buttons. The method comprises the following steps: acquiring a capacitive charging signal generated by a user finger-touching a capacitive button; processing the capacitive charging signal to extract Mel-frequency cepstrum coefficient characteristics; and inputting the Mel-frequency cepstrum coefficient characteristics into a trained hidden Markov model, identifying a finger type of the user touching the capacitive button, and further implementing human-computer interaction according to an identification result. The present application utilizes the capacitive charging signals generated by touching the capacitive buttons with different fingers to perform button interaction, thus solving the problem of difficult interaction of capacitive buttons, and the present application trains a hidden Markov chain model by taking the Mel-frequency cepstrum coefficient of the capacitive charging signals as the characteristic, thereby improving the identification accuracy.

10 Claims, 5 Drawing Sheets

HUMAN-COMPUTER INTERACTION METHOD AND INTERACTION SYSTEM BASED ON CAPACITIVE BUTTONS

TECHNICAL FIELD

The present application relates to the technical field of human-computer interaction, and in particular to a human-computer interaction method and an interaction system based on capacitive buttons.

BACKGROUND

The traditional capacitive sensing button (or capacitive button for short) input is performed by touching a button with a finger, but this input mode can only detect whether a finger of a user touches the button, but cannot detect which one touches.

Currently, some researchers detect which finger of a user touches a button by wearing an electromagnet on the fingers of the user, but this implementation requires the user to wear the electromagnet on the fingers, which results in increased use cost and reduced use experience of the user.

SUMMARY

The present application is intended to overcome the defects of the prior art described above and provides a human-computer interaction method and an interaction system based on capacitive buttons, which can accurately identify a finger type of a user touching a capacitive sensing button.

According to a first aspect of the present application, provided is a human-computer interaction method based on a capacitive button. The method comprises the following steps:

acquiring a capacitive charging signal generated by a user finger-touching a capacitive button;

processing the capacitive charging signal to extract Mel-frequency cepstrum coefficient characteristics; and inputting the Mel-frequency cepstrum coefficient characteristics into a trained hidden Markov model, identifying a finger type of the user touching the capacitive button, and further implementing human-computer interaction according to an identification result.

According to a second aspect of the present application, provided is a human-computer interaction system based on a capacitive button. The system comprises:

a signal acquisition unit, used for acquiring a capacitive charging signal generated by a user finger-touching a capacitive button;

a signal processing unit, used for processing the capacitive charging signal to extract Mel-frequency cepstrum coefficient characteristics; and a classification and identification unit, used for inputting the Mel-frequency cepstrum coefficient characteristics into a trained hidden Markov model, identifying a finger type of the user touching the capacitive button, and further implementing human-computer interaction according to an identification result.

Compared with the prior art, the present application has the advantages that the button interaction is performed by using capacitive charging signals generated by touching capacitive buttons with different fingers, so that the problem of difficult interaction of capacitive buttons is solved; the present application solves the problem that the capacitive charging signal is changed due to the change of the duration time of the same finger touching buttons by extracting the Mel-frequency cepstrum coefficient of the signal as the characteristic and using the trained hidden Markov chain model.

Other features of the present application and advantages thereof will become apparent from the following detailed description of exemplary embodiments of the present application with reference to the accompanying drawings.

BRIEF DESCRIPTION OF DRAWINGS

The accompanying drawings, which are incorporated in and constitute a part of this specification, illustrate the embodiments of the present application and together with the description, serve to explain the principles of the present application.

DETAILED DESCRIPTION OF THE EMBODIMENTS

Various exemplary embodiments of the present application will now be described in detail with reference to the accompanying drawings. It should be noted that: the relative arrangement of the components and steps, the numerical expressions and numerical values set forth in these embodiments do not limit the scope of the present application unless it is specifically stated otherwise.

The following description of at least one exemplary embodiment is merely illustrative in nature and is in no way intended to limit the present application, application thereof or use thereof.

Techniques, methods, and devices known to those of ordinary skills in the relevant art may not be discussed in detail, but the techniques, methods, and devices should be considered as a part of the specification where appropriate.

In all examples shown and discussed herein, any specific value should be construed as exemplary only rather than limiting. Thus, other examples of the exemplary embodiments may have different values.

It should be noted that: like reference numbers and letters refer to like items in the following figures, and thus, once an item is defined in one figure, it does not need to be further discussed in subsequent figures.

Figure 1:
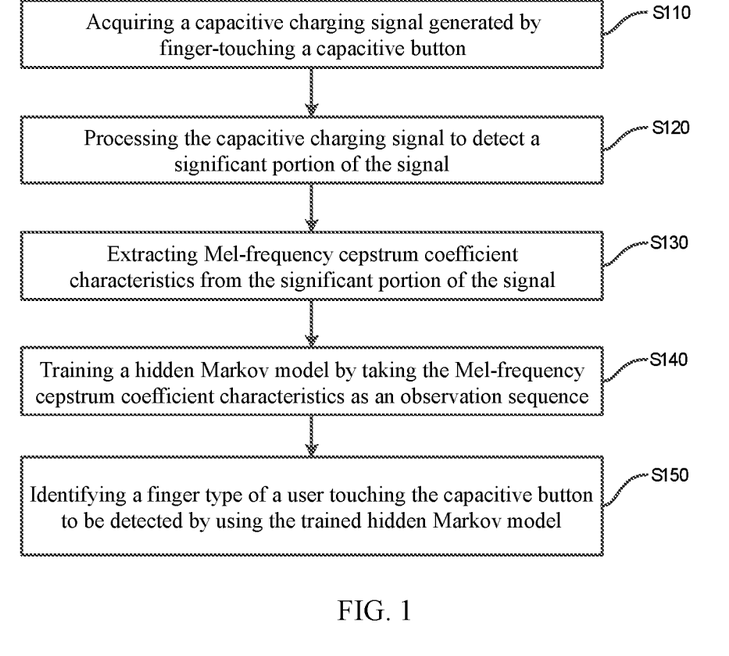
FIG. 1 is a flow diagram of a human-computer interaction method based on a capacitive button according to an embodiment of the present application.
Figure 2:
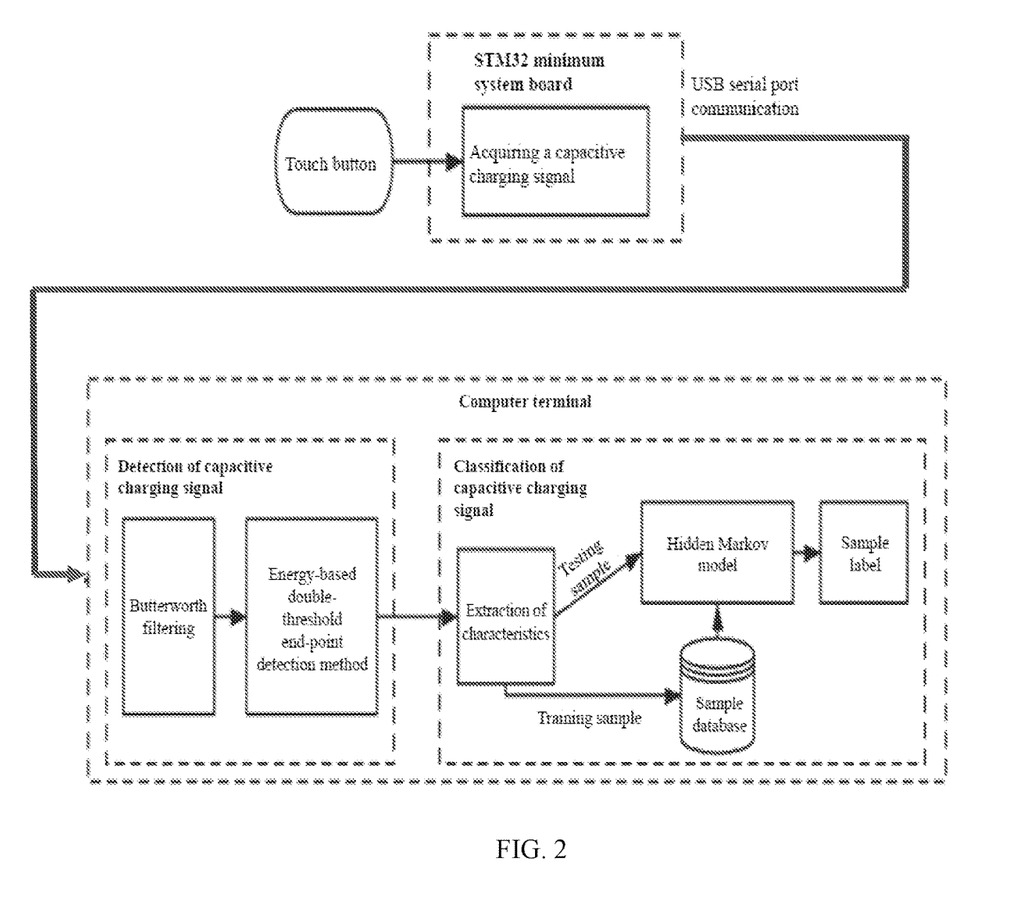
FIG. 2 is a schematic diagram of a process for a human-computer interaction method based on a capacitive button according to an embodiment of the present application.

With reference to FIG. 1 and FIG. 2, the human-computer interaction method based on a capacitive button provided by the present application comprises the following steps:

Step S110, Acquiring a Capacitive Charging Signal Generated by Finger-Touching a Capacitive Button.

Specifically, a hardware development board can be used for acquiring a capacitive charging signal generated by a user touching a capacitive button, wherein the hardware development board may be an embedded control board, a single-chip microcomputer and other controllers in some household electronic products. For example, the hardware development board may be an STM32 hardware development board, an Arduino hardware development board, or other types. The following description will be given by taking an STM32 hardware development board as an example.

Figure 3:
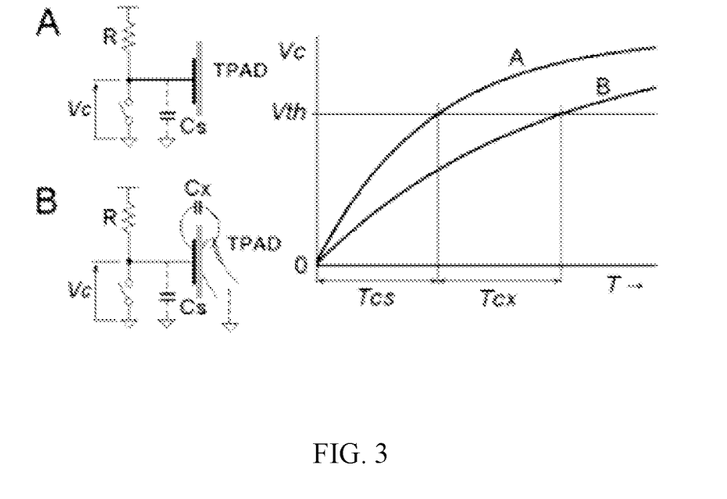
FIG. 3 is a schematic diagram of an operating principle of a capacitive touch button according to an embodiment of the present application.

To facilitate understanding of the present application, FIG. 3 shows the operating principle of the capacitive touch button, wherein R is the external capacitive charging and discharging resistor, and Cs is the stray capacitance between the TPAD and the PCB when no touch is pressed. Cx is the capacitance formed between the finger and the TPAD when the finger is touched and pressed, so that when the finger is touched and pressed, Cs is connected with Cx in parallel, and the total capacitance value is Cx+Cs. For different capacitances, it takes different time for the charging voltage to reach the same threshold Vth under the same other factors. The larger the capacitance, the longer the time required.

Figure 4:
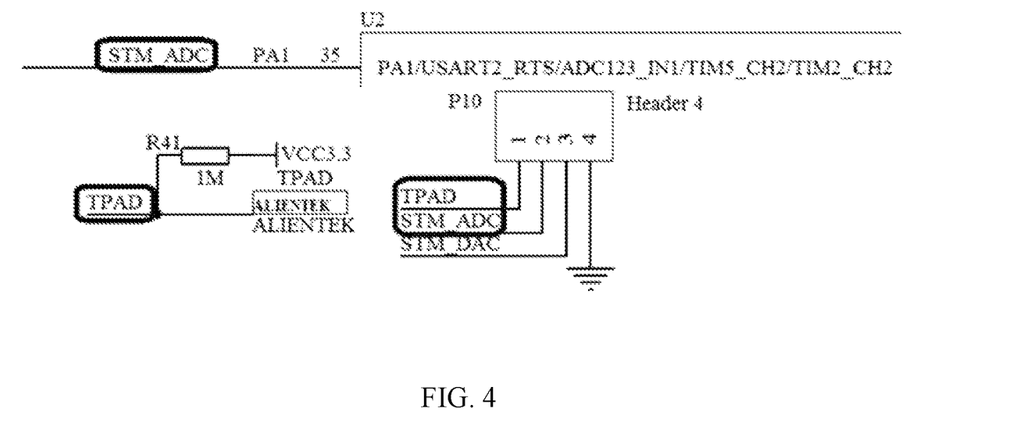
FIG. 4 is a diagram of a hardware connection of a capacitive button to an STM32 minimum system board according to an embodiment of the present application.

In one embodiment, acquiring a capacitive charging signal generated by finger-touching a capacitive button comprises:

Step S101, connecting a TPAD of the capacitive touch button to a PA1 pin of an STM32 minimum system board, as shown in FIG. 4.

Step S102, calculating a charging time of the capacitive touch button.

Figure 5:
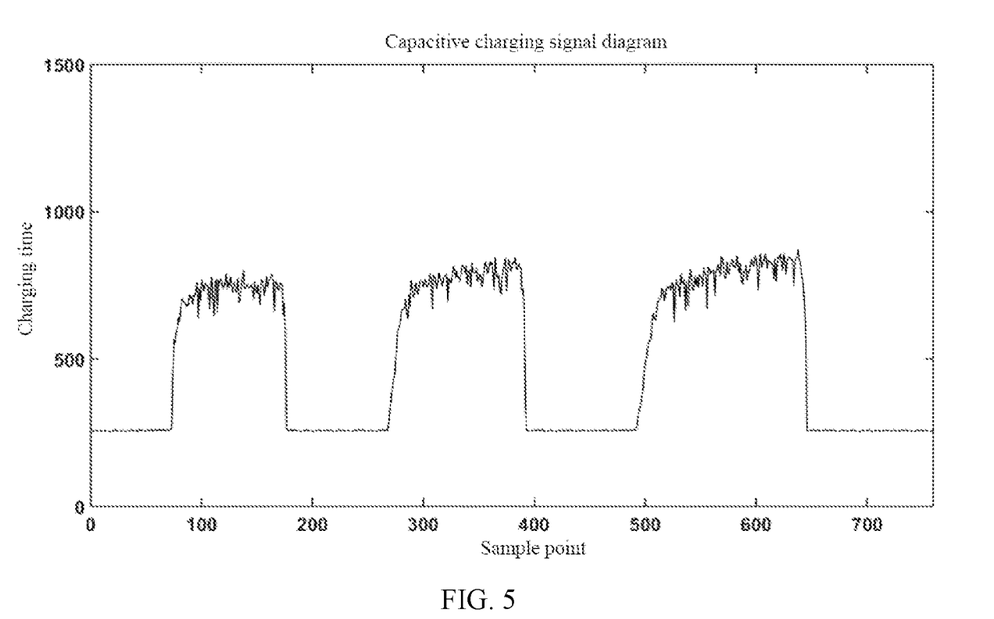
FIG. 5 is a diagram of a capacitive charging signal according to an embodiment of the present application.

Specifically, firstly, the TPAD pin is set to be push-pull output, 0 is output, and the capacitance is discharged to 0; the TPAD pin is set to be in a floating input state (the state after IO reset), and the capacitance starts to be charged; and meanwhile, the input capture of the TPAD pin is started for capture followed by waiting for the completion of charging (charging to Vx, detecting a rising edge); and the charging time is calculated as a capacitive charging signal. In this way, as shown in FIG. 5, the charging time (e.g., in ms) of a plurality of sample points can be obtained.

The capacitive charging signal calculated in this step can represent the characteristics of different types of finger touch buttons, such as duration time and touch force.

Step S120, Processing the Capacitive Charging Signal to Detect a Significant Portion of the Signal.

In practical application, the capacitive charging signal can be sent to an information processing device (e.g., a computer) for processing. The signal sending mode may be a USB serial port communication mode, a Socket communication mode or other types of communication modes.

Taking the use of USB serial port communication as an example, the communication mode is full-duplex asynchronous communication; and a data format with a baud rate of 115,200 and a word length of 8 is initialized, wherein the data format has 1 stop bit and no parity bit;

In one embodiment, an energy-based double-threshold end-point detection method is used to detect the significant portion of the signal, which specifically comprises:

Step S201, filtering, by a computer, the signal using a Butterworth bandpass filter after receiving the signal sent by the STM32 minimum system board, with cutoff frequencies of 10 Hz and 1000 Hz, respectively.

Step S202, calculating a short-time energy of the capacitive charging signal, wherein the short-time energy is calculated according to the following formula:

$$E(t) = \sum_{i=t}^{t+L} s^2(i) \quad (1)$$

wherein E is a short-time energy of a frame signal, L is a length of the frame signal, S(i) is an amplitude of the capacitive charging signal, and t represents a time index of the frame signal.

Step S203, calculating an average energy of the noise, recording the average energy as u, and calculating a standard deviation of the signal energy and recording the standard deviation as σ; and setting a low threshold as TL=u+σ and a high threshold as TH=u+3σ during cut-off.

Step S204, setting two parameters according to experience: a maximum interval maxInter between signal peaks of the same signal, and a minimum length minLen of the signal.

Step S205, finding out a frame of signal with a maximum energy in the signal, wherein the energy of the frame of signal is required to be higher than the set high threshold TH=u+3σ.

Step S206, extending the frame of signal to the left and right respectively until the energy of a next frame of signal is lower than the set low threshold TL=u+σ, recording frame positions at this time, taking a frame position obtained on the left as a starting point of the signal peak and a frame position obtained on the right as an end point of the signal peak, and simultaneously setting the frame energy at the position of the signal peak in the signal as zero.

Step S207, repeating the steps S205 and S206 until all signal peaks in the whole signal are found.

Step S208, if an interval between two signal peaks is smaller than maxInter, then combining the two signal peaks.

Step S209, repeating S208 until the intervals between all signal peaks are larger than maxInter.

Step S210, if a length of a signal peak is smaller than minLen, then directly discarding the signal peak.

Step S211, finally obtaining one signal peak, wherein the signal peak is the significant portion of the signal.

Step S212, if the number of signal peaks obtained in S211 is larger than 1, then regarding the signal as an invalid signal and directly discarding the signal.

By detecting a significant portion of a signal, a capacitive charging signal generated due to an unintentional touch of a user can be filtered out, so that the accuracy of subsequent identification is improved.

It should be noted that those skilled in the art can set different low thresholds and high thresholds or interval thresholds between signal peaks according to statistical analysis or experience.

Step S130, Extracting Mel-Frequency Cepstrum Coefficient Characteristics from the Significant Portion of the Signal.

In one embodiment, extracting Mel-frequency cepstrum coefficients from the significant portion of the signal specifically comprises:

Step S301, performing pre-emphasis, framing and windowing on the extracted significant portion of the capacitive charging signal.

For example, the pre-emphasis coefficient is 0.96, the frame length is 20 ms, the frame shift is 6 ms, and the window function is a Hamming window.

Step S302, performing a fast Fourier transform (FFT) for each frame to obtain a corresponding frequency spectrum.

Step S303, passing the obtained frequency spectrum through a Mel filter bank to obtain a Mel-frequency spectrum.

For example, the Mel filtering frequency range is 10 Hz to 1000 Hz, and the number of filter channels is 28.

Step S304, logarithmizing the obtained Mel-frequency spectrum, then performing discrete cosine transform (DCT), and finally, for example, taking the first 14 coefficients as Mel-frequency cepstrum coefficients (MFCCs).

It should be understood that the extracted Mel-frequency cepstrum coefficients are not limited to 14, and an appropriate number of Mel-frequency cepstrum coefficients may be extracted according to the accuracy and execution speed requirements of the training model. In addition, the prior art, such as pre-emphasis, framing, windowing and Fourier transform, is not specifically described herein.

Step S140, Training a Hidden Markov Model by Taking the Mel-Frequency Cepstrum Coefficient Characteristics as an Observation Sequence.

By utilizing the process described above, a training sample can be constructed for representing a corresponding relation between the Mel-frequency cepstrum coefficient characteristics of the capacitive charging signal and the finger type of the touch button.

Furthermore, the hidden markov model is trained by using the training sample, taking Mel-frequency cepstrum coefficients of the capacitive charging signal as an observation sequence and using a Baum-Welch algorithm, for example, the number of states of the hidden markov model is 3, and each state has 2 Gaussian mixture probability density functions. The specific training process comprises the following steps: initializing parameters of the hidden Markov model; calculating forward and backward probability matrixes; calculating a transition probability matrix; calculating the mean value and the variance of each Gaussian probability density function; calculating the weight of each Gaussian probability density function; and calculating output probabilities of all observation sequences, and accumulating the output probabilities to obtain a sum output probability.

In the training process, for each type of finger, a corresponding hidden markov model can be generated so as to obtain a plurality of hidden markov models. In addition, the number of iterations in the training process can be set according to the requirements on computing resources and training time.

After training is finished, in order to evaluate the effectiveness of the model, classification and identification are performed by using test data, a capacitive charging signal in actual use is taken as the test data, and the test data are processed by using a method for processing the training data; and the probability of the test data is calculated based on the hidden Markov model so as to identify the input of the capacitive button. For example, the test process comprises the following steps: calculating an output probability of test data to each hidden Markov model by using a Viterbi algorithm and giving an optimal state path; and outputting a category corresponding to a hidden Markov model with a maximum probability as a classification result of the test data.

In this step, the case that the capacitive charging signal is changed due to the change of the duration time of the same finger touching buttons can be accurately identified and different finger types can be accurately distinguished by selecting a hidden Markov model and taking the Mel-frequency cepstrum coefficient characteristics as an observation sequence.

Step S150, Identifying a Finger Type of a User Touching the Capacitive Button to be Detected by Using the Trained Hidden Markov Model.

It should be understood that the training process of hidden markov model may also be performed off-line in an information processing device such as a server, a cloud or a computer. In practical application, the trained hidden Markov model can be integrated into electronic devices for implementing human-computer interaction, namely, a capacitive charging signal generated by a user finger-touching a capacitive button is acquired in real time and Mel-frequency cepstrum coefficient characteristics are extracted, the Mel-frequency cepstrum coefficient characteristics are input into the trained hidden Markov model, and therefore the finger type of the user touching the capacitive button is identified, and human-computer interaction is further achieved according to an identification result.

For example, a button is designed so that a user can touch the button with different fingers to select different functions, thereby expanding the interactive function of the button, for example, an index finger, when used to press a button, represents that a function is opened, a middle finger represents storage, and a ring finger represents deletion. In this way, the interactive function achieved by five buttons can be implemented by one button.

In summary, the human-computer interaction system based on a capacitive button provided by the present application utilizes capacitive charging signals generated by touching a capacitive button with different fingers to perform button interaction, and also can accurately identify the type of finger touching the button. Through the present application, a smaller number of buttons can be designed to implement miniaturization of electronic products. For example, the present application can be implemented in intelligent watches. As the screen of the intelligent watch is small, the screen can be basically touched by only one finger. However, the interactive function of intelligent watches can be greatly improved by using the present application.

The present application may be a system, a method and/or a computer program product. The computer program product may include a computer-readable storage medium having computer-readable program instructions loaded thereon for causing a processor to implement various aspects of the present application.

The computer-readable storage medium may be a tangible device that holds and stores the instructions for use by an instruction execution device. The computer-readable storage medium may include, but is not limited to, for example, an electronic storage device, a magnetic storage device, an optical storage device, an electromagnetic storage device, a semiconductor storage device, or any suitable combination of the foregoing. More specific examples (non-exhaustive list) of the computer-readable storage medium include: a portable computer disk, a hard disk drive, a random access memory (RAM), a read-only memory (ROM), an erasable programmable read-only memory (EPROM or flash memory), a static random access memory (SRAM), a portable compact disc read-only memory (CD-ROM), a digital versatile disc (DVD), a memory stick, a floppy disk, a mechanical coding device such as punch card or in-groove raised structure having instructions stored thereon, and any suitable combination of the foregoing. The computer-readable storage medium as used herein is not to be interpreted as a transitory signal per se, such as a radio wave or other freely propagating electromagnetic wave, an electromagnetic wave propagating through a waveguide or other transmission medium (e.g., optical pulses through a fiber optic cable), or an electrical signal transmitted through an electrical wire.

The computer-readable program instructions described herein may be downloaded from a computer-readable storage medium to computing/processing devices, or to an external computer or external storage device via a network, such as the Internet, a local area network, a wide area network and/or a wireless network. The network may include copper transmission cables, fiber optic transmission, wireless transmission, routers, firewalls, switches, gateway computers and/or edge servers. The network adapter card or network interface in each computing/processing device receives a computer-readable program instruction from the network and forwards the computer-readable program instruction for storage in a computer-readable storage medium in each computing/processing device.

Computer program instructions for executing operations of the present application may be assembler instructions, instruction set architecture (ISA) instructions, machine instructions, machine-related instructions, microcode, firmware instructions, state setting data, or source or object code in any combination of one or more programming languages including an object-oriented programming language such as Smalltalk and C++, and a conventional procedural programming language such as the "C" language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet service provider). In some embodiments, aspects of the present application are implemented by personalizing an electronic circuit, such as a programmable logic circuit, a field programmable gate array (FPGA) or a programmable logic array (PLA), with state information of computer-readable program instructions, the electronic circuit being capable of executing the computer-readable program instructions.

Aspects of the present application are described herein with reference to a flowchart and/or block diagrams of methods, apparatus (systems) and computer program products according to embodiments of the present application. It should be understood that each block of the flowchart and/or block diagrams, and combinations of blocks in the flowchart and/or block diagrams, can be implemented by computer-readable program instructions.

These computer-readable program instructions can be provided to the processor of a general-purpose computer, a special-purpose computer, or other programmable data processing apparatus, thereby producing a machine that causes these instructions, when executed by the processor of the computer or other programmable data processing apparatus, produce an apparatus that implements the functions/motions specified in one or more blocks of the flowchart and/or block diagrams. These computer-readable program instructions may also be stored in a computer readable storage medium, wherein these instructions can direct a computer, a programmable data processing apparatus and/or other devices to function in a particular manner, such that the computer readable medium storing the instructions comprises an article of manufacture including instructions which implement the functions/motions specified in the one or more blocks of the flowchart and/or block diagrams.

The computer-readable program instructions may also be loaded onto a computer, other programmable data processing apparatus or other devices to cause a series of operational steps to be executed on the computer, other programmable apparatus or other devices to produce a computer implemented process such that the instructions executed on the computer, other programmable data processing apparatus or other devices implement the functions/motions specified in the one or more blocks of the flowchart and/or block diagrams.

The flowchart and block diagrams in the figures illustrate the architecture, functions, and operation of possible implementations of the system, method and computer program product according to various embodiments of the present application. In this regard, each block in the flowchart or block diagrams may represent a portion of a module, segment or instructions which comprises one or more executable instructions for implementing the specified logical functions. In some alternative implementations, the functions noted in the blocks may occur out of the order noted in the figures. For example, two blocks shown in succession may, in fact, be executed substantially concurrently, or the blocks may sometimes be executed in the reverse order, depending upon the functions involved. It should also be noted that each block in the block diagrams and/or the flowchart, and combinations of blocks in the block diagrams and/or the flowchart, can be implemented by special-purpose hardware-based systems that perform the specified functions or motions, or by combinations of special-purpose hardware and computer instructions. It is well known to those skilled in the art that the implementations by hardware and software and a combination of software and hardware are equivalent.

While various embodiments of the present application have been described above, the descriptions are exemplary, not exhaustive, and not limited to the disclosed embodiments. Many modifications and variations will be apparent to those of ordinary skill in the art without departing from the scope and spirit of the described embodiments. The terms used herein are chosen in order to best explain the principles of the embodiments, the practical application or technical improvements in the market, or to enable others of ordinary skill in the art to understand the embodiments disclosed herein. The scope of the present application is defined by the appended claims.

What is claimed is:

1. A human-computer interaction method based on a capacitive button, comprising the following steps:
    acquiring a capacitive charging signal generated by a user finger-touching a capacitive button;
    processing the capacitive charging signal to extract Mel-frequency cepstrum coefficient characteristics; and
    inputting the Mel-frequency cepstrum coefficient characteristics into a trained hidden Markov model, identifying a finger type of the user touching the capacitive button, and further implementing human-computer interaction according to an identification result.

2. The human-computer interaction method based on a capacitive button according to claim 1, wherein the capacitive charging signal is acquired and transmitted via a hardware development board.

3. The human-computer interaction method based on a capacitive button according to claim 2, wherein the hardware development board is an STM32 minimum system board, and a TPAD of the capacitive touch button is connected to a PA1 pin of the STM32 minimum system board.

4. The human-computer interaction method based on a capacitive button according to claim 1, wherein extracting Mel-frequency cepstrum coefficient characteristics comprises:
    filtering the capacitive charging signal;
    calculating a short-time energy of the filtered signal;
    intercepting a significant portion of the signal by using the short-time energy;

performing pre-emphasis, framing and windowing on the intercepted significant portion of the signal;

obtaining a corresponding frequency spectrum through short-time Fourier transform for each short-time analysis window; and obtaining a Mel-frequency spectrum by passing the obtained frequency spectrum through a Mel filter bank, and performing cepstrum analysis on the Mel-frequency spectrum to obtain a Mel-frequency cepstrum coefficient corresponding to the capacitive charging signal.

5. The human-computer interaction method based on a capacitive button according to claim 4, wherein intercepting a significant portion of the signal comprises:

setting a first cut-off threshold and a second cut-off threshold based on a standard deviation $\sigma$ of the short-time energy of the capacitive charging signal, wherein the first cut-off threshold is $TL=u+\sigma$, the second cut-off threshold is $TH=u+3\sigma$, and u is an average energy of background noise;

finding out a frame of signal with a maximum short-time energy in the signal, wherein the energy of the frame of signal is higher than the second cut-off threshold; and finding out a frame having an energy lower than the first cut-off threshold and being closest to the frame of signal in time sequence from a preamble frame and a subsequent frame of the frame of signal, respectively, taking an obtained position of the preamble frame as a starting point, taking an obtained position of the subsequent frame as an end point, and intercepting a portion between the starting point and the end point as the significant portion of the signal.

6. The human-computer interaction method based on a capacitive button according to claim 5, wherein intercepting the significant portion of the signal further comprises:

setting a maximum interval threshold maxInter and a minimum length threshold minLen between signal peaks for the capacitive charging signal;

if an interval between two signal peaks of the capacitive charging signal is smaller than the maximum interval threshold maxInter, then taking the two signal peaks as a signal peak of the capacitive charging signal; and if a length of a signal peak of the capacitive charging signal is smaller than the minimum length threshold minLen, then discarding the signal peak.

7. The human-computer interaction method based on a capacitive button according to claim 1, wherein the hidden Markov model is trained according to the following steps:

constructing a training sample, wherein the training sample is used for representing a corresponding relation between the Mel-frequency cepstrum coefficients of the capacitive charging signal and the finger type of the touch button; and training the hidden Markov model by taking the Mel-frequency cepstrum coefficients of the capacitive charging signal as an observation sequence and using a Baum-Welch algorithm, wherein one hidden Markov model is trained for each finger type.

8. The human-computer interaction method based on a capacitive button according to claim 1, wherein the method further comprises:

calculating an output probability of test data to each hidden Markov model by using a Viterbi algorithm and giving an optimal state path; and outputting a category corresponding to a hidden Markov model with a maximum probability as a classification result of the test data.

9. A human-computer interaction system based on a capacitive button, comprising:

a signal acquisition unit, used for acquiring a capacitive charging signal generated by a user finger-touching a capacitive button;

a signal processing unit, used for processing the capacitive charging signal to extract Mel-frequency cepstrum coefficient characteristics; and a classification and identification unit, used for inputting the Mel-frequency cepstrum coefficient characteristics into a trained hidden Markov model, identifying a finger type of the user touching the capacitive button, and further implementing human-computer interaction according to an identification result.

10. A non-transitory computer-readable storage medium having a computer program stored thereon, wherein the program, when executed by a processor, implements the steps of the method according to claim 1.

* * * * *